US009793091B1

(12) United States Patent
Teshima et al.

(10) Patent No.: US 9,793,091 B1
(45) Date of Patent: Oct. 17, 2017

(54) IMAGE GENERATION APPARATUS (71) Applicant: NGR Inc., Yokohama (JP)

(72) Inventors: Hideaki Teshima, Yokohama (JP); Kazufumi Kubota, Yokohama (JP); Eiji Sato, Yokohama (JP); Shigeyuki Sato, Yokohama (JP); Kenichiro Kashiwazaki, Yokohama (JP); Yuta Uraike, Yokohama (JP)

(73) Assignee: NGR Inc., Yokohama (JP)

( * ) Notice: Subject to any disclaimer, the term of this patent is extended or adjusted under 35 U.S.C. 154(b) by 0 days.

(21) Appl. No.: 15/195,136

(22) Filed: Jun. 28, 2016

(51) Int. Cl.
| H01J 37/26 | (2006.01) |
| H01J 37/22 | (2006.01) |
| H01J 37/28 | (2006.01) |
| H01J 37/06 | (2006.01) |
| H01J 37/147 | (2006.01) |
| H01J 37/244 | (2006.01) |

(52) U.S. Cl.
CPC ............ *H01J 37/222* (2013.01); *H01J 37/06* (2013.01); *H01J 37/147* (2013.01); *H01J 37/244* (2013.01); *H01J 37/28* (2013.01); H01J 2237/0216 (2013.01); H01J 2237/2448 (2013.01)

(58) Field of Classification Search
CPC ...... H01J 3/26; H01J 3/36; H01J 23/09; H01J 29/46; H01J 29/465; H01J 29/70; H01J 37/10; H01J 37/147; H01J 37/1472; H01J 2223/09; H01J 2237/15
USPC ..... 250/396 R, 397, 306, 307, 309, 310, 311
See application file for complete search history.

(56) References Cited

U.S. PATENT DOCUMENTS

| 2013/0301954 | A1 | 11/2013 | Shirai et al. |
| 2014/0025195 | A1* | 1/2014 | Ahmadpour ......... G05B 19/416 |
| | | | 700/188 |
| 2014/0204976 | A1* | 7/2014 | Peroulis .................. G01K 7/34 |
| | | | 374/184 |

FOREIGN PATENT DOCUMENTS

| JP | 60-117721 | 6/1985 |
| JP | 06-188181 | 7/1994 |
| JP | 10-097836 | 4/1998 |
| JP | 10-208679 | 8/1998 |
| JP | 2005-166538 | 6/2005 |
| JP | 2008-130361 | 6/2008 |

(Continued)

*Primary Examiner* — Nicole Ippolito
(74) *Attorney, Agent, or Firm* — Lathrop Gage LLP (57) ABSTRACT

There is disclosed an image generation apparatus which is capable of generating a clear image by reducing vibration of the image. The image generation apparatus includes an electron-optics column having an electron gun, a deflector, a condenser lens, and an objective lens, a displacement detector for detecting a displacement of an XY stage, a stage-position measuring device for specifying a position of the XY stage based on an output signal of the displacement detector, an accelerometer for detecting vibration of the electron-optics column, an acceleration-signal processing device for processing an output signal of the accelerometer, and a deflection-controlling device for controlling operation of the deflector. The deflection-controlling device adds a first vibration signal outputted from the acceleration-signal processing device to a second vibration signal outputted from the stage-position measuring device to generate a deflection correcting signal, and causes the deflector to correct the deflection of a charged-particle beam based on the deflection correcting signal.

7 Claims, 7 Drawing Sheets

(56) References Cited

FOREIGN PATENT DOCUMENTS

| JP | 2010-092634 | 4/2010 |
| JP | 2012-151053 | 8/2012 |
| JP | 2014-093153 | 5/2014 |
| JP | 2014-216207 | 11/2014 |

* cited by examiner

IMAGE GENERATION APPARATUS

BACKGROUND

The present invention relates to an image generation apparatus for generating an image of a specimen, such as a wafer or the like, and more particularly to an image generation apparatus applicable to a scanning electron microscope for use in a pattern inspection apparatus for inspecting fine patterns on the order of submicron.

With the trend toward finer semiconductor devices, scanning electron microscopes have been often used for semiconductor inspection. In recent years, pattern sizes have become smaller and smaller. Such small-sized patterns entail a stricter demand for an inspection accuracy of a pattern inspection apparatus. In the pattern inspection apparatus, an electron-optics column emits a charged-particle beam that strikes a wafer, and secondary electron signals obtained are converted into an image. The image is compared with reference image data or CAD data for dimensions, shapes, etc. so as to evaluate whether patterns have been properly formed.

In order to inspect fine patterns on the order of nanometers, it is important to reduce a pixel size for an inspection image and to obtain a secondary electron image with less noise. It is thus necessary to suppress vibration and drift on the order of nanometers of an XY stage mechanism which supports a wafer.

Usually, the pattern inspection apparatus is installed in the same environment as a semiconductor manufacturing apparatus. Therefore, it is difficult to attenuate floor vibration and acoustic vibration with a passive anti-vibration table, an active anti-vibration table, and a sound-absorbing material, which are conventional techniques. Under such background, there has been proposed a method for directing a charged-particle beam to an accurate position by measuring vibration of a stage when an image is created and correcting an incident position of the charged-particle beam on the basis of an amount of fluctuation of the table.

As disclosed in Japanese laid-open patent publication No. 60-117721 and Japanese laid-open patent publication No. 2005-166538, there have been also proposed a method in which a vibration signal from an accelerometer, installed in an electron-optics column, is used to correct an incident position of a charged-particle beam. Japanese laid-open patent publication No. 2014-93153 discloses another approach which is to predict vibration of an electron-optics column from an image vibration and use the predicted vibration in correcting an incident position of a charged-particle beam. Japanese laid-open patent publication No. 2012-151053 discloses a frequency analyzing technique for an image vibration.

The above-described patent documents disclose a solution using a difference between two accelerometers mounted on a lower and intermediate portions, or upper and lower portions of an electron-optics column as a signal for correcting an incident position of a charged-particle beam, and a solution of determining frequencies of a low-pass filter and a band-pass filter on the basis of the natural frequencies of an electron-optics column. However, it is impossible to determine which of the natural frequencies of the electron-optics column is affected by a disturbance of the environment in which the pattern inspection apparatus is installed. Moreover, although the frequency of vibration caused by the environment of the site where the pattern inspection apparatus is installed does not vary greatly, the magnitude of the vibration vary at all times, which is problematic.

SUMMARY OF THE INVENTION

According to an embodiment of the present invention, there is provided an image generation apparatus which is capable of generating a clear image by reducing vibration of the image.

According to the embodiment of the present invention, there is provided an image generation apparatus for generating an image of a specimen by scanning the specimen with a charged-particle beam and detecting secondary electrons emitted from the specimen. The apparatus comprises: an XY stage on which the specimen can be placed; an electron-optics column having an electron gun, a deflector, a condenser lens, and an objective lens; a secondary-electron detector configured to detect the secondary electrons; a displacement detector configured to detect a displacement of the XY stage; a stage-position measuring device configured to specify a position of the XY stage based on an output signal of the displacement detector; an accelerometer configured to detect vibration of the electron-optics column; an acceleration-signal processing device configured to process an output signal of the accelerometer; an imaging device configured to convert an output signal of the secondary-electron detector into an image; a deflection-controlling device configured to control operation of the deflector; and a control computer for controlling operations of the deflection-controlling device and the acceleration-signal processing device, wherein the deflection-controlling device configured to add up a first vibration signal, outputted from the acceleration-signal processing device, and a second vibration signal, outputted from the stage-position measuring device, to produce a deflection correcting signal, and cause the deflector to correct deflection of the charged-particle beam based on the deflection correcting signal.

In an embodiment, the acceleration-signal processing device has a band-pass filter configured to filter the output signal of the accelerometer, and the band-pass filter has a passband which is preset based on a frequency of the vibration of the electron-optics column.

In an embodiment, the control computer is configured to: obtain, from the imaging device, a first image of the specimen which has been generated without correcting the deflection of the charged-particle beam; produce a first frequency spectrum by performing a frequency analysis on the first image; obtain, from the imaging device, a second image of the specimen which has been generated while correcting the deflection of the charged-particle beam based only on the second vibration signal; produce a second frequency spectrum by performing a frequency analysis on the second image; subtract the second frequency spectrum from the first frequency spectrum to calculate a difference at each of frequencies; determine a frequency band in which the difference is larger than a threshold value; and set the frequency band to the passband of the band-pass filter.

In an embodiment, the displacement detector comprises a laser interferometer having a reference mirror disposed adjacent to the objective lens and a measurement mirror secured to the XY stage.

In an embodiment, the image generation apparatus further comprises a low-pass filter disposed between the stage-position measuring device and the deflection-controlling device, the low-pass filter being configured to allow passage of only frequencies lower than a natural frequency of a member to which the reference mirror is secured.

In an embodiment, the XY stage includes an electrostatic chuck configured to hold the specimen.

In an embodiment, there is provided an image generation method for generating an image of a specimen by scanning the specimen with a charged-particle beam and detecting secondary electrons emitted from the specimen. The method comprises: generating a first image of the specimen on an XY stage without correcting deflection of the charged-particle beam; producing a first frequency spectrum by performing a frequency analysis on the first image; generating a second image of the specimen on the XY stage while correcting the deflection of the charged-particle beam in a direction to remove vibration of the XY stage; producing a second frequency spectrum by performing a frequency analysis on the second image; subtracting the second frequency spectrum from the first frequency spectrum to calculate a difference at each of frequencies; determining a frequency band in which the difference is larger than a threshold value; setting the frequency band to a passband of a band-pass filter; producing a first vibration signal representing vibration of an electron-optics column which has an electron gun, a deflector, a condenser lens, and an objective lens; passing the first vibration signal through the band-pass filter; producing a second vibration signal representing vibration of the XY stage; adding the first vibration signal, which has passed through the band-pass filter, to the second vibration signal to produce a deflection correcting signal; and generating an image of the specimen by scanning the specimen on the XY stage with the charged-particle beam and detecting secondary electrons emitted from the specimen while the deflector is correcting the deflection of the charged-particle beam based on the deflection correcting signal.

According to the above embodiments, even when the XY stage on which the specimen is placed and the electron-optics column are vibrated due to floor vibration and acoustic vibration in the environment in which the image generation apparatus is installed, a frequency band to be corrected can be identified by performing a frequency analysis on image vibration. This operation makes it possible to correct a deviation of an incident position of the charged-particle beam. As a result, vibration of an image to be generated can be reduced, and hence a clear image can be generated.

DESCRIPTION OF EMBODIMENTS

Embodiments of the present invention will be described in detail below with reference to the drawings.

Figure 1:
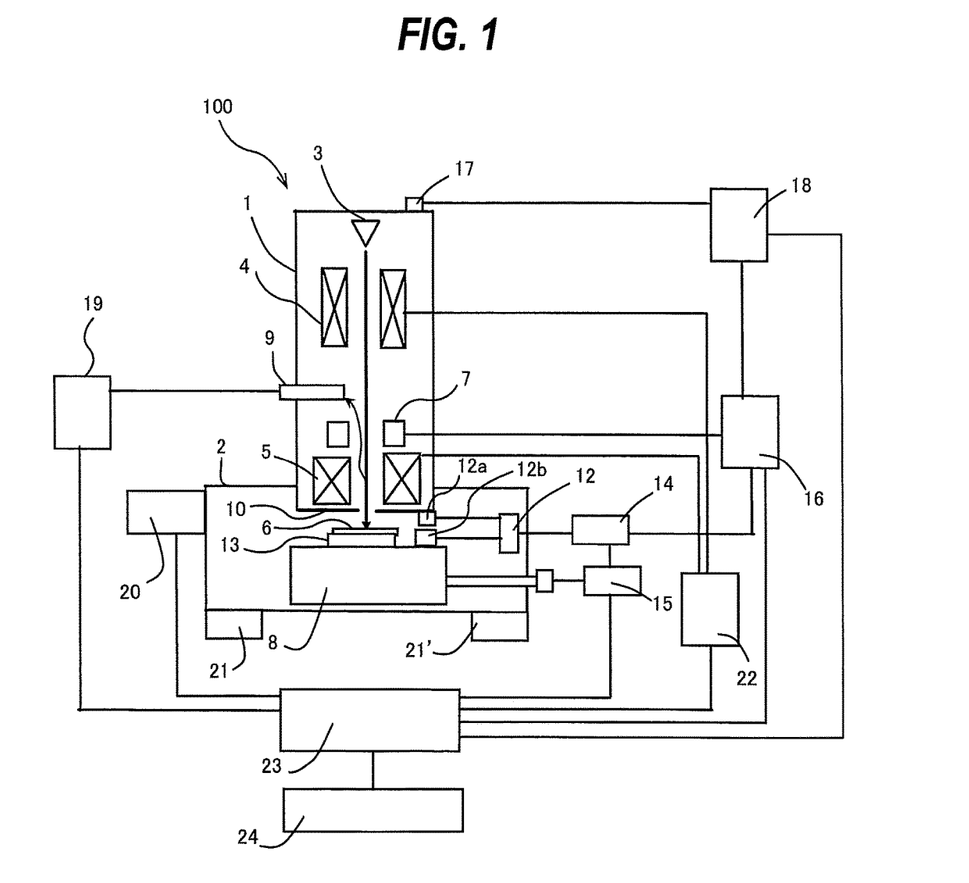
FIG. 1 is a schematic diagram showing an embodiment of an image generation apparatus.

FIG. 1 is a schematic diagram showing an embodiment of an image generation apparatus 100. As shown in FIG. 1, the image generation apparatus 100 includes an electron-optics column 1 and a specimen chamber 2. The electron-optics column 1 has an electron gun 3 for emitting a charged-particle beam of primary electrons, a condenser lens 4 for converging the charged-particle beam emitted by the electron gun 3, a deflector 7 for deflecting the charged-particle beam in an X direction and a Y direction, and an objective lens 5 for focusing the charged-particle beam onto a wafer 6 which is a specimen.

The electron gun 3, the condenser lens 4, a secondary-electron detector 9, the deflector 7, and the objective lens 5 are arrayed in this order. The electron-optics column 1 has a lower end coupled to the specimen chamber 2 with a pedestal 10 interposed between the electron-optics column 1 and the specimen chamber 2. The specimen chamber 2 is located below the objective lens 5. An XY stage 8, which is movable in the X direction and the Y direction, is disposed in the specimen chamber 2. The wafer 6 can be loaded into and unloaded from the specimen chamber 2 by a wafer transporting device 20. The XY stage 8 includes an electrostatic chuck 13 by which the wafer 6 is secured to the XY stage 8.

The charged-particle beam emitted from the electron gun 3 is converged by the condenser lens 4. Thereafter, the charged-particle beam is focused onto the surface of the wafer 6 by the objective lens 5, while the charged-particle beam is deflected by the deflector 7. When the primary electrons of the charged particles strike the wafer 6, the wafer 6 emits secondary electrons, which are detected by the secondary-electron detector 9.

The condenser lens 4 and the objective lens 5 are coupled to a lens-controlling device 22, which is coupled to a control computer 23. The secondary-electron detector 9 is coupled to an imaging device 19. The imaging device 19 is configured to convert an output signal of the secondary-electron detector 9 into an image. This imaging device 19 is also coupled to the control computer 23. The deflector 7 is coupled to a deflection-controlling device 16, so that a deflecting operation of the deflector 7 is controlled by the deflection-controlling device 16. This deflection-controlling device 16 is also coupled to the control computer 23.

The XY stage 8 is coupled to an XY-stage controlling device 15, and a position of the XY stage 8 is controlled by the XY-stage controlling device 15. The XY-stage controlling device 15 is coupled to the control computer 23. The wafer transporting device 20 is also coupled to the control computer 23. Operations of the lens-controlling device 22, the imaging device 19, the deflection-controlling device 16, the XY-stage controlling device 15, and the wafer transporting device 20 are controlled by the control computer 23. The control computer 23 is coupled to an operation computer 24.

A laser interferometer 12 is a displacement detector for detecting a displacement of the XY stage 8. The laser interferometer 12 is disposed in the specimen chamber 2. The laser interferometer 12 includes a reference mirror 12a disposed adjacent to the objective lens 5, and a measurement mirror 12b fixed to the XY stage 8.

The reference mirror 12a has a higher natural frequency than a natural frequency of the XY stage 8. The reference mirror 12a is attached to a position which vibrates in synchronization with the objective lens 5 of the electron-optics column 1. According to the present embodiment, the reference mirror 12a is installed on the pedestal 10, which is a rigid body fixed to the lower end of the electron-optics column 1. The pedestal 10 has an exposed surface located in the specimen chamber 2, and the reference mirror 12a is fixed to this exposed surface of the pedestal 10.

The reference mirror 12a is fixed to the pedestal 10 which is a highly rigid member. In addition, the wafer 6 is held by the electrostatic chuck 13. Therefore, the positional information of the XY stage 8 is free of unwanted components.

The measurement mirror 12b is attached to a position which vibrates in synchronization with the wafer 6 which is an object to be measured. This position of the measurement mirror 12b is such that the measurement mirror 12b can receive a laser beam at the same height as the wafer surface. The laser interferometer 12 is coupled to a stage-position measuring device 14. This stage-position measuring device 14 is configured to specify the position of the XY stage 8 on the basis of the displacement signal outputted from the laser interferometer 12. The stage-position measuring device 14 is coupled to the XY-stage controlling device 15 and the deflection-controlling device 16.

Deflection set values, such as a pixel size, a scanning size, and a scanning speed, are sent from the control computer 23 to the deflection-controlling device 16. The deflection-controlling device 16 is configured to produce a deflection operation signal for the deflector 7. The deflector 7 operates according to the deflection operation signal to deflect the charged-particle beam.

An accelerometer 17, which is attached to an upper portion of the electron-optics column 1, comprises a device capable of measuring accelerations in three directions along X, Y, and Z axes. According to the present embodiment, the accelerometer 17 is attached to the top of the electron-optics column 1. The accelerometer 17 is coupled to an acceleration-signal processing device 18, and an output signal of the accelerometer 17 is processed by the acceleration-signal processing device 18. The acceleration-signal processing device 18 is coupled to the deflection-controlling device 16 and the control computer 23. An operation of the acceleration-signal processing device 18 is controlled by the control computer 23.

Correction of the deflection of the charged-particle beam, which is composed of primary electrons, is carried out by the laser interferometer 12 which detects the displacement of the wafer 6, the stage-position measuring device 14 which processes the displacement signal from the laser interferometer 12, the accelerometer 17 which measures the vibration of the electron-optics column 1, the acceleration-signal processing device 18 which processes the output signal of the accelerometer 17, the deflector 7 which deflects the charged-particle beam, the deflection-controlling device 16 which controls the operation of the deflector 7, and the control computer 23.

Figure 2:
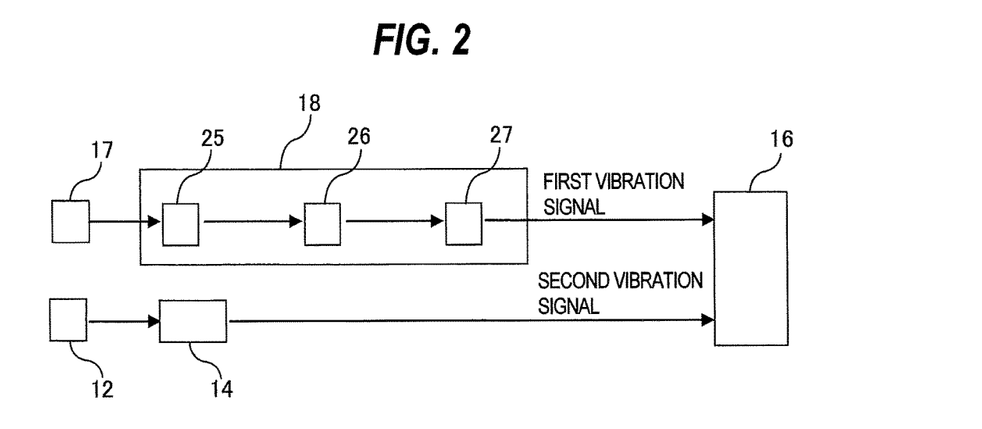
FIG. 2 is a schematic diagram showing an embodiment in which a deflection correcting signal is produced by a deflection-controlling device.

FIG. 2 is a schematic diagram showing an embodiment in which a deflection correcting signal is produced by the deflection-controlling device 16. According to the present embodiment, the acceleration-signal processing device 18 includes a band-pass filter 25 coupled to the accelerometer 17, a phase correcting circuit 26 for correcting the output signal of the accelerometer 17 such that the direction of the acceleration, measured by the accelerometer 17, coincides with the direction of the image vibration, and a gain control circuit 27 for correcting the output signal of the accelerometer 17 such that the magnitude of the acceleration, measured by the accelerometer 17, coincides with the magnitude of the image vibration:

The band-pass filter 25 is configured to allow passage of only frequencies within a passband designated by the control computer 23. The output signal of the accelerometer 17 is processed by the band-pass filter 25, the phase correcting circuit 26, and the gain control circuit 27 of the acceleration-signal processing device 18. A signal outputted from the acceleration-signal processing device 18 is a vibration signal representing the vibration of the electron-optics column 1, particularly, the vibration of the upper portion of the electron-optics column 1. The signal outputted from the acceleration-signal processing device 18 will hereinafter be referred to as a first vibration signal. The first vibration signal, which is outputted from the acceleration-signal processing device 18, is inputted to the deflection-controlling device 16.

A signal outputted from the stage-position measuring device 14 is not only a signal specifying the position of the XY stage 8, but also a vibration signal representing the vibration of the XY stage 8. The signal outputted from the stage-position measuring device 14 will hereinafter be referred to as a second vibration signal. As with the first vibration signal, the second vibration signal outputted from the stage-position measuring device 14 is inputted to the deflection-controlling device 16.

The deflection-controlling device 16 is configured to add up the first vibration signal and the second vibration signal to produce the deflection correcting signal. The deflection-controlling device 16 subtracts this deflection correcting signal from the deflection operation signal that has been produced for the deflector 7, thereby correcting the deflection operation signal in a direction to remove the vibration of the XY stage 8 and the vibration of the electron-optics column 1. The deflection-controlling device 16 sends the corrected deflection operation signal to the deflector 7, which operates according to the corrected deflection operation signal. Specifically, the deflector 7 deflects the charged-particle beam at a pixel size, a scanning size, and a scanning speed that have been designated in advance, while correcting the deflection of the charged-particle beam on the basis of the deflection correcting signal.

Although FIG. 2 shows the acceleration-signal processing device 18 with respect to one of the X, Y, and Z axes, acceleration-signal processing devices which have the same structure as the acceleration-signal processing device 18 are also provided for the other two of the X, Y, and Z axes. The passbands of the band-pass filters 25 can be set individually.

Figure 3:
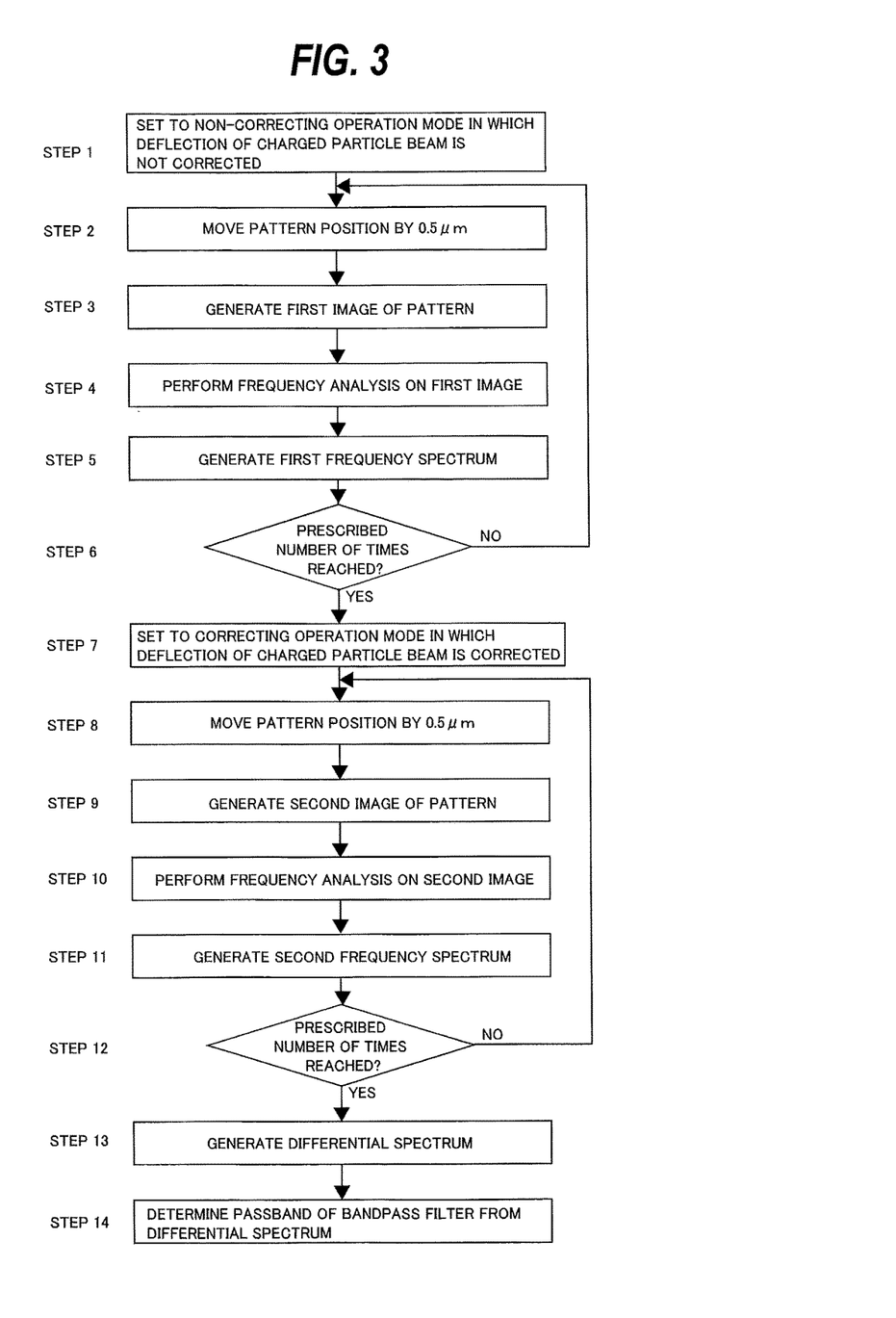
FIG. 3 is a flowchart illustrating a process of determining a passband of a band-pass filter.

FIG. 3 is a flowchart illustrating a process of determining the passband of the band-pass filter 25. First, the XY stage 8 moves the wafer 6 such that a field of view of the charged-particle beam is located on a pattern (e.g., a line pattern) of the wafer 6. The deflection-controlling device 16 is set to a non-correcting operation mode in which correction of an incident position of the charged-particle beam using the displacement signal from the laser interferometer 12 is not performed (step 1). The deflection-controlling device 16 is set to the non-correcting operation mode through the operation computer 24 and the control computer 23. In this non-correcting operation mode, the deflection-controlling device 16 does not produce the above-discussed deflection correcting signal, and does not correct the deflection operation signal that has been produced for the deflector 7. Therefore, the deflection of the charged-particle beam is not corrected.

The XY stage 8 moves the position of the pattern by a predetermined distance, e.g., 0.5 μm (step 2). A pixel size is set to 0.5 nm or less in order to acquire an image at a high magnification. The scanning speed and the scanning size are determined so as to enable a frequency analysis at 1.5 KHz or higher, and the image generation apparatus 100 generates one first image of the pattern (step 3). This is for the purpose of being able to analyze an influence of 800 Hz which is a rotational frequency of a vacuum turbo pump that can be a source of the vibration. The control computer 23 obtains the first image from the imaging device 19, and performs a one-dimensional frequency analysis on the first image (step 4). In this embodiment, the one-dimensional frequency analysis is an FFT analysis (Fast Fourier Transform analysis).

Figure 4:
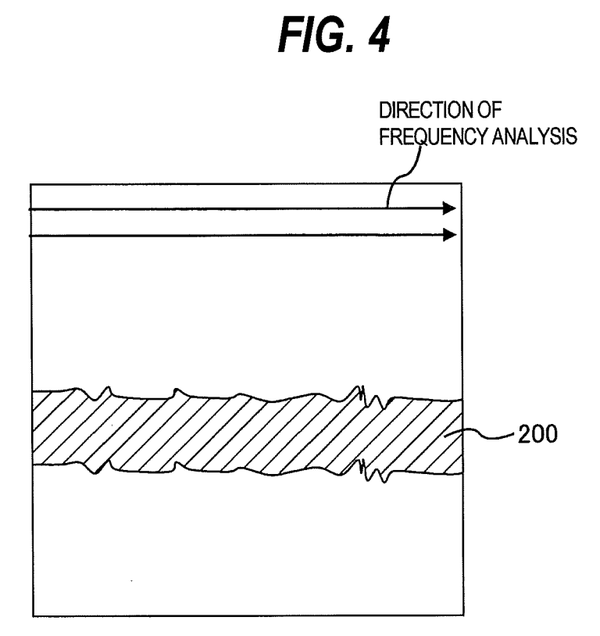
FIG. 4 is a diagram showing an example of a first image obtained by the image generation apparatus.
Figure 5:
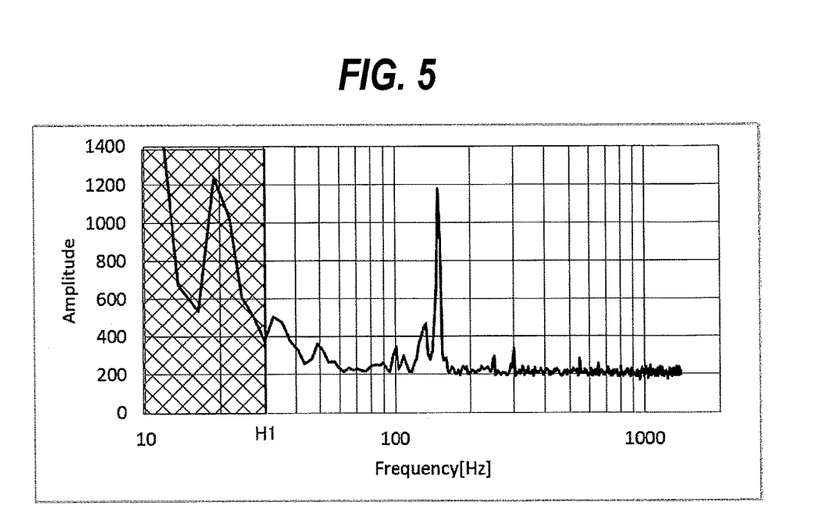
FIG. 5 is a diagram showing an example of a first frequency spectrum representing a result of a frequency analysis of the first image.

FIG. 4 is a diagram showing an example of the first image obtained by the image generation apparatus 100. The frequency analysis is carried out by converting a waveform shape of an edge of a pattern 200 that appears on the first image into frequency and amplitude, while scanning the first image in one direction at predetermined intervals. The control computer 23 calculates an average of a plurality of frequency spectra obtained from a plurality of (e.g., 40 or 50) scan lines including a scan line at which the largest amplitude has been obtained. The average of the plurality of frequency spectra is a first frequency spectrum representing the result of the frequency analysis of the first image (step 5). FIG. 5 shows an example of the first frequency spectrum. As shown in FIG. 5, in order to distinguish the vibration from noises, a band of not more than a predetermined frequency H1 is not treated as an object of the deflection correction.

Referring back to FIG. 3, the processes from the step 2 to the step 5 are repeated predetermined times (step 6). This is because, as the disturbance vibration varies with time, a characteristic of the disturbance cannot be grasped by one frequency analysis. In addition, repeating the processes is also for the purpose of reducing the influence of a roughness of the pattern itself by changing locations where images are generated.

Subsequently, the deflection-controlling device 16 is set to a correcting operation mode in which an incident position of the charged-particle beam is corrected using the displacement signal from the laser interferometer 12 (step 7). In this correcting operation mode, the deflection-controlling device 16 produces the deflection correcting signal only from the second vibration signal outputted from the stage-position measuring device 14, and corrects the deflection operation signal to be transmitted to the deflector 7. Therefore, the deflection of the charged-particle beam is corrected in a direction to remove the vibration of the XY stage 8.

Figure 6:
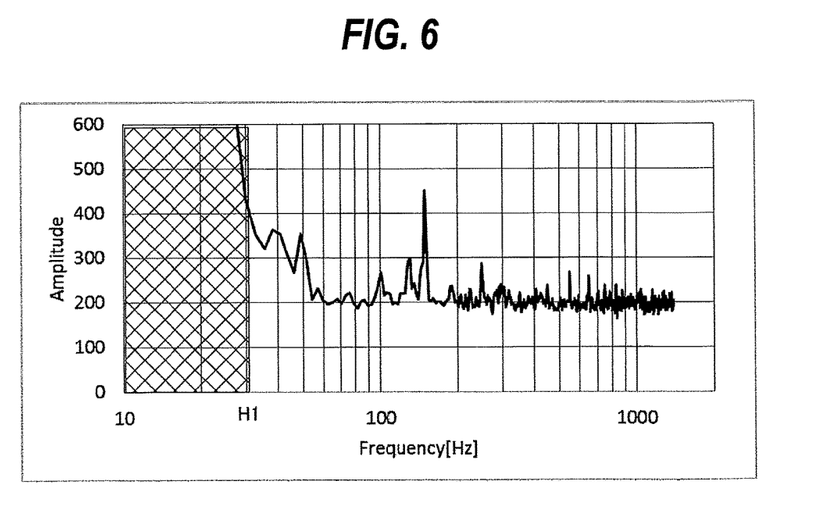
FIG. 6 is a diagram showing an example of a second frequency spectrum representing a result of a frequency analysis of a second image.

Steps 8, 9, 10, 11, 12, which are similar to the above-described steps 2, 3, 4, 5, 6, are carried out. Specifically, the stage 8 moves the position of the pattern by a predetermined distance, e.g., 0.5 μm (step 8). The image generation apparatus 100 generates a second image of the pattern (step 9). The control computer 23 obtains the second image of the pattern from the imaging device 19, and performs a one-dimensional frequency analysis on the second image (step 10). Further, the control computer 23 produces a second frequency spectrum representing the result of the frequency analysis of the second image (step 11). An example of the second frequency spectrum representing the result of the frequency analysis of the second image is shown in FIG. 6.

Figure 7:
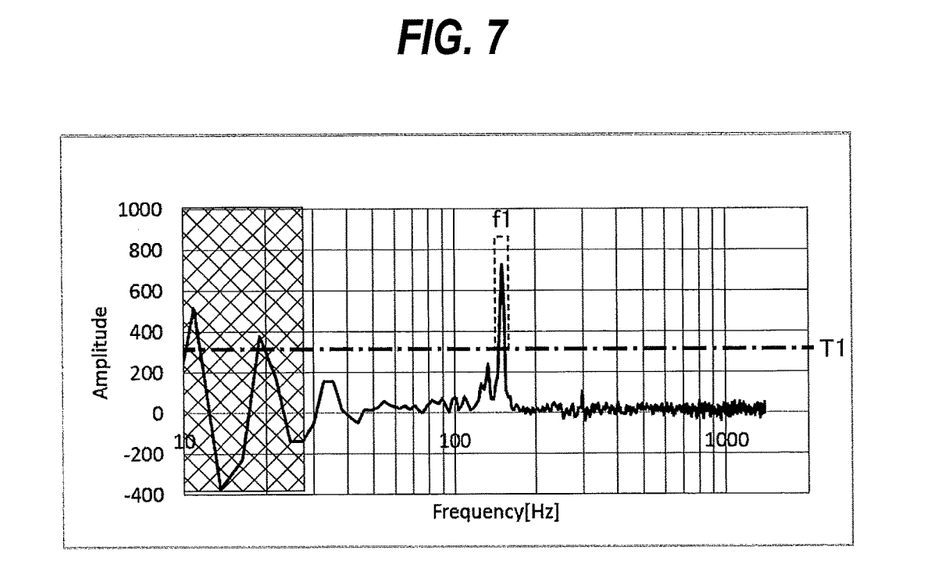
FIG. 7 is a diagram showing an example of a differential spectrum obtained by subtracting the second frequency spectrum from the first frequency spectrum.

The processes from the step 8 to the step 11 are repeated predetermined times (step 12). Further, the control computer 23 subtracts the second frequency spectrum from the first frequency spectrum to calculate a difference at each of frequencies, thereby generating a differential spectrum as shown in FIG. 7 (step 13). Further, as described below, the control computer 23 determines the passband of the band-pass filter 25 on the basis of the differential spectrum (step 14).

Frequencies of the vibration components that appear on the differential spectrum shown in FIG. 7 are frequencies at which the incident position of the charged-particle beam is to be corrected. More specifically, the frequencies of the vibration components that appear on the corrective spectrum are the frequencies to be set as the passband of the band-pass filter 25. Frequencies in this passband are presumed to correspond to the vibration frequencies of the upper portion of the electron-optics column 1.

As shown in FIG. 7, in order to distinguish the image vibration from vibration caused by other factors (e.g., magnetic field variation) than the disturbance, the control computer 23 determines a frequency band in which the difference is greater than a threshold value T1, and sets the determined frequency band to the passband of the band-pass filter 25. Frequencies at which the difference is smaller than the threshold value T1 are frequencies which are not treated as an object of the deflection correction. In the example shown in FIG. 7, the frequency band denoted by a symbol f1 is selected as the passband of the band-pass filter 25.

Figure 8:
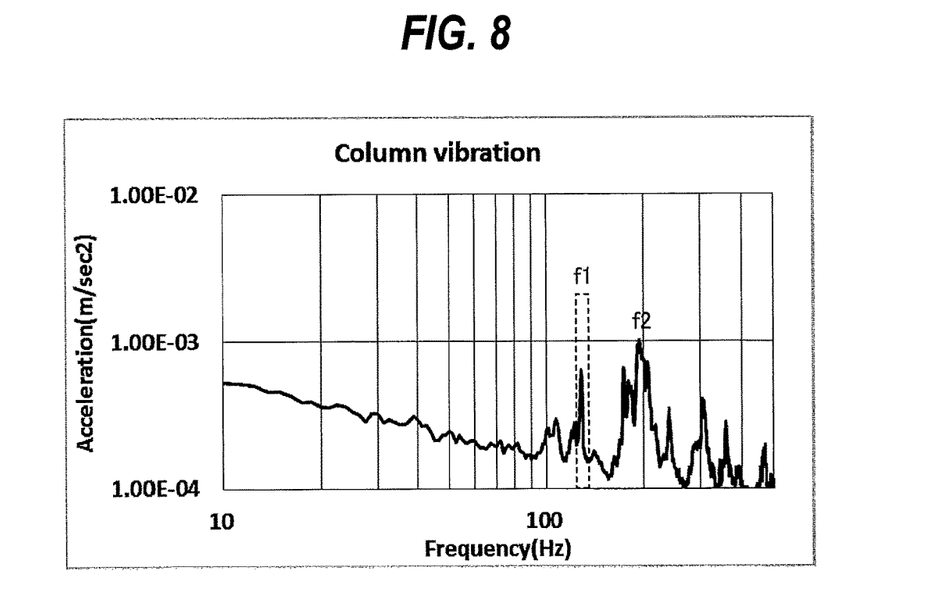
FIG. 8 is a diagram showing a result of a frequency analysis of an output signal of an accelerometer.

FIG. 8 is a diagram showing a result of the frequency analysis of the output signal of the accelerometer 17. The passband of the band-pass filter 25 is the frequency band f1 that has been determined according to the flowchart shown in FIG. 3. Vibration components in the frequency band f1 are used for the deflection correction, and vibration components with frequencies other than the frequency band f1 are not used for the deflection correction. For example, a vibration component with a frequency f2 is a vibration component that does not need to be corrected because its influence on the image vibration is small.

While the above-described process has been carried out with respect to scanning in one direction, it is also carried out with respect to scanning in other directions in the same manner.

After the passband of the band-pass filter 25 has been determined according to the above-described steps, an image of the wafer 6 is generated. When the image is being generated, as shown in FIG. 2, the acceleration-signal processing device 18 including the band-pass filter 25 outputs the first vibration signal containing vibration information of the electron-optics column 1, while the stage-position measuring device 14 outputs the second vibration signal containing vibration information of the XY stage 8. The deflection controller 16 adds up the first vibration signal and the second vibration signal to produce the deflection correcting signal. The deflection-controlling device 16 subtracts this deflection correcting signal from the deflection operation signal to be transmitted to the deflector 7, thereby correcting the deflection operation signal in a direction to remove the vibration of the XY stage 8 and the vibration of the electron-optics column 1. The deflector 7 operates according to the corrected deflection operation signal, thus correcting the incident position of the charged-particle beam on the wafer 6.

Figure 9:
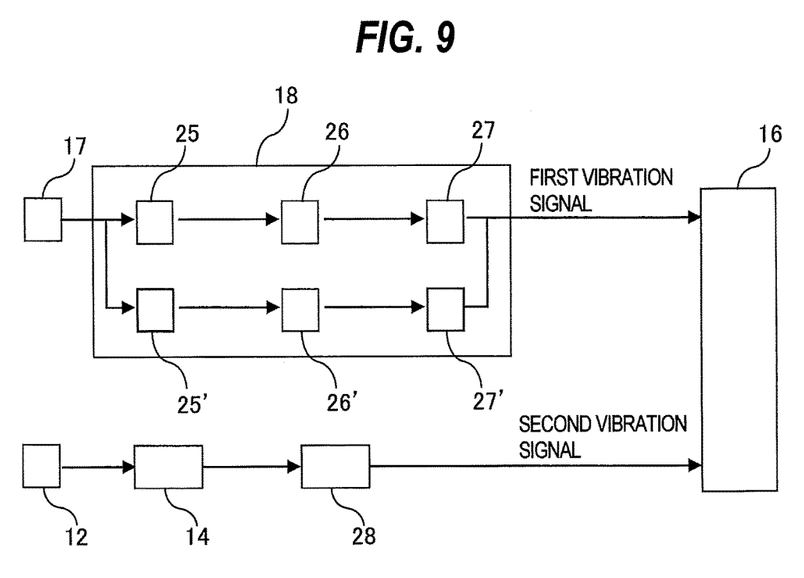
FIG. 9 is a schematic diagram showing an embodiment in which a deflection correcting signal is produced by a deflection-controlling device.

In the present embodiment, the single band-pass filter 25 is used to filter the signal from the accelerometer 17. Alternatively, as shown in FIG. 9, a plurality of band-pass filters 25, 25' may be used. According to the embodiment shown in FIG. 9, the acceleration-signal processing device 18 includes a band-pass filter 25', a phase correcting circuit 26', and a gain control circuit 27', which are parallel to the band-pass filter 25, the phase correcting circuit 26, and the gain control circuit 27 which have been described previously.

Further, according to the embodiment shown in FIG. 9, the acceleration-signal processing device 18 is provided with a low-pass filter 28 for filtering the output signal of the stage-position measuring device 14. The low-pass filter 28 is configured to allow passage of only frequencies lower than the natural frequency of the member to which the reference mirror 12a is fixed. The low-pass filter 28 is disposed between the stage-position measuring device 14 and the deflection-controlling device 16. The output signal of the stage-position measuring device 14 passes through the low-pass filter 28, and is then inputted as the second vibration signal to the deflection-controlling device 16.

According to the embodiments described above, even when the XY stage 8 on which the specimen is placed and the electron-optics column 1 are vibrated due to floor vibration and acoustic vibration in the environment in which the image generation apparatus is installed, a frequency band to be corrected can be identified by performing the frequency analysis on the image vibration, and the deviation of the incident position of the charged-particle beam is corrected. As a result, vibration of an image to be generated can be reduced, and hence a clear image can be generated.

The image generation apparatus 100 described above is applicable to a pattern inspection apparatus for inspecting patterns by obtaining a pattern image, to be inspected, of a specimen and comparing the pattern image, to be inspected, with a reference pattern or reference data, such as CAD data, for dimensions, shapes, etc.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. An image generation apparatus for generating an image of a specimen by scanning the specimen with a charged-particle beam and detecting secondary electrons emitted from the specimen, said apparatus comprising:
   an XY stage on which the specimen can be placed;
   an electron-optics column having an electron gun, a deflector, a condenser lens, and an objective lens;
   a secondary-electron detector configured to detect the secondary electrons;
   a displacement detector configured to detect a displacement of the XY stage;
   a stage-position measuring device configured to specify a position of the XY stage based on an output signal of the displacement detector;
   an accelerometer configured to detect vibration of the electron-optics column;
   an acceleration-signal processing device configured to process an output signal of the accelerometer;
   an imaging device configured to convert an output signal of the secondary-electron detector into an image;
   a deflection-controlling device configured to control operation of the deflector; and
   a control computer for controlling operations of the deflection-controlling device and the acceleration-signal processing device,
   wherein the deflection-controlling device configured to add up a first vibration signal, outputted from the acceleration-signal processing device, and a second vibration signal, outputted from the stage-position measuring device, to produce a deflection correcting signal, and cause the deflector to correct deflection of the charged-particle beam based on the deflection correcting signal.

2. The image generation apparatus according to claim 1, wherein:
   the acceleration-signal processing device has a band-pass filter configured to filter the output signal of the accelerometer; and
   the band-pass filter has a passband which is preset based on a frequency of the vibration of the electron-optics column.

3. The image generation apparatus according to claim 2, wherein the control computer is configured to:
   obtain, from the imaging device, a first image of the specimen which has been generated without correcting the deflection of the charged-particle beam;
   produce a first frequency spectrum by performing a frequency analysis on the first image;
   obtain, from the imaging device, a second image of the specimen which has been generated while correcting the deflection of the charged-particle beam based only on the second vibration signal;
   produce a second frequency spectrum by performing a frequency analysis on the second image;
   subtract the second frequency spectrum from the first frequency spectrum to calculate a difference at each of frequencies;
   determine a frequency band in which the difference is larger than a threshold value; and
   set the frequency band to the passband of the band-pass filter.

4. The image generation apparatus according to claim 1, wherein the displacement detector comprises a laser interferometer having a reference mirror disposed adjacent to the objective lens and a measurement mirror secured to the XY stage.

5. The image generation apparatus according to claim 4, further comprising:
   a low-pass filter disposed between the stage-position measuring device and the deflection-controlling device, the low-pass filter being configured to allow passage of only frequencies lower than a natural frequency of a member to which the reference mirror is secured.

6. The image generation apparatus according to claim 1, wherein the XY stage includes an electrostatic chuck configured to hold the specimen.

7. An image generation method for generating an image of a specimen by scanning the specimen with a charged-particle beam and detecting secondary electrons emitted from the specimen, said method comprising:
   generating a first image of the specimen on an XY stage without correcting deflection of the charged-particle beam;
   producing a first frequency spectrum by performing a frequency analysis on the first image;
   generating a second image of the specimen on the XY stage while correcting the deflection of the charged-particle beam in a direction to remove vibration of the XY stage;
   producing a second frequency spectrum by performing a frequency analysis on the second image;

subtracting the second frequency spectrum from the first frequency spectrum to calculate a difference at each of frequencies;

determining a frequency band in which the difference is larger than a threshold value;

setting the frequency band to a passband of a band-pass filter;

producing a first vibration signal representing vibration of an electron-optics column which has an electron gun, a deflector, a condenser lens, and an objective lens;

passing the first vibration signal through the band-pass filter;

producing a second vibration signal representing vibration of the XY stage;

adding the first vibration signal, which has passed through the band-pass filter, to the second vibration signal to produce a deflection correcting signal; and generating an image of the specimen by scanning the specimen on the XY stage with the charged-particle beam and detecting secondary electrons emitted from the specimen while the deflector is correcting the deflection of the charged-particle beam based on the deflection correcting signal.

\* \* \* \* \*